United States Patent
Johnson

(10) Patent No.: US 9,304,150 B2
(45) Date of Patent: Apr. 5, 2016

(54) CLOSED CORE CURRENT PROBE

(75) Inventor: Kenneth W. Johnson, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1103 days.

(21) Appl. No.: 13/249,836

(22) Filed: Sep. 30, 2011

(65) Prior Publication Data

US 2013/0082695 A1    Apr. 4, 2013

(51) Int. Cl.
*G01N 27/72*    (2006.01)
*G01R 15/20*    (2006.01)
*G01R 1/067*    (2006.01)
*G01R 15/18*    (2006.01)

(52) U.S. Cl.
CPC .......... *G01R 15/207* (2013.01); *G01R 1/06766* (2013.01); *G01R 1/06788* (2013.01); *G01R 15/183* (2013.01); *G01R 15/202* (2013.01)

(58) Field of Classification Search
CPC .. G01R 15/183; G01R 15/202; G01R 15/207; G01R 1/06766; G01R 1/06788
USPC .................... 324/207.2, 251, 117 H
See application file for complete search history.

(56) References Cited

U.S. PATENT DOCUMENTS

| | | | |
|---|---|---|---|
| 1,887,421 A * | 11/1932 | Newman | 200/2 |
| 5,642,041 A * | 6/1997 | Berkcan | 324/127 |
| 5,717,326 A * | 2/1998 | Moriwaki | 324/117 H |
| 6,512,359 B1 * | 1/2003 | Tamai et al. | 324/117 R |
| 6,940,265 B2 * | 9/2005 | Hauenstein et al. | 324/117 H |
| 7,250,748 B2 * | 7/2007 | Hastings et al. | 324/117 R |
| 7,526,971 B2 * | 5/2009 | Mandziuk et al. | 73/866.5 |
| 7,583,073 B2 * | 9/2009 | Kumar et al. | 324/117 R |
| 8,330,453 B2 * | 12/2012 | Hotz et al. | 324/207.2 |
| 8,680,843 B2 * | 3/2014 | Ausserlechner | 324/126 |
| 2004/0164533 A1 * | 8/2004 | Pettypiece, Jr. | 280/735 |
| 2006/0082357 A1 * | 4/2006 | Tsukamoto | 324/126 |
| 2006/0284613 A1 | 12/2006 | Hastings et al. | |
| 2007/0257662 A1 * | 11/2007 | Mende et al. | 324/117 R |
| 2010/0156394 A1 | 6/2010 | Ausserlechner et al. | |
| 2011/0031966 A1 * | 2/2011 | Park et al. | 324/240 |
| 2011/0036172 A1 * | 2/2011 | Park et al. | 73/668 |
| 2011/0109303 A1 * | 5/2011 | Zhitomirsky | 324/207.15 |
| 2011/0144933 A1 * | 6/2011 | Hoelscher | 702/64 |
| 2013/0082695 A1 * | 4/2013 | Johnson | 324/243 |
| 2014/0009146 A1 * | 1/2014 | Blagojevic et al. | 324/252 |

* cited by examiner

*Primary Examiner* — Jay Patidar

(57) ABSTRACT

A current probe enabling measurement of current of a signal in a circuit includes a ferrite core defining a gap, a wire wrapped around the ferrite core and a magnetic field sensor. The wire is configured to receive the signal from the circuit, where the current of the signal flowing in the wire generates a magnetic field in the ferrite core. The magnetic field sensor is positioned in the gap of the ferrite core, the magnetic field generated in the ferrite core flowing through the magnetic field sensor, which produces a voltage proportional to an intensity of the magnetic field. The current is measured based on the voltage produced by the magnetic field sensor.

16 Claims, 10 Drawing Sheets

CLOSED CORE CURRENT PROBE

BACKGROUND

Electronic test equipment, such as oscilloscopes, depends on probes to receive input signals to be analyzed. Conventional AC/DC current probes, in particular, utilize split core configuration. A split core configuration is one in which a magnetic field sensor, such as a Hall Effect sensor, works in conjunction with a ferrite core which concentrates the flux field. The ferrite core is split into two parts, so that the ferrite core can be opened and closed, enabling insertion of a conductor carrying the current to be measured.

Although split core probes may be reliable, they tend to be physically large in order to achieve the opening and closing feature, and thus conventional split core probes are substantially limited to larger targets, currents, conductors, and the like. For example, because the current probes are disproportionately large compared to the device under test (DUT), they create a mechanical burden on the DUT itself. More particularly, conventional current probes incorporate a loop of wire that is connected to the DUT, through which the measured current passes. A split core type current probe has a movable jaw that opens and closes around the loop of wire. This movable jaw configuration adds additional bulk to the current probe, and also increases manufacturing costs. Additionally, the large current probes can be position sensitive, so that movement of the current probes causes variations in measurements. Measurement results are thus not repeatable or otherwise inconsistent with respect to one another. Additionally, since split core probes allow the user to control the size and orientation of the current path through the split core, they suffer some repeatability issues.

Some conventional current probes are fixed core type, which do not include the movable jaws, and which are smaller and less costly than the split core type current probes. However, such current probes require that the wire carrying the measured current be threaded through an opening of the current probe. Thus, the use model requires that the wire be unsoldered in order to relocate the current probe from point to point on the DUT, which in turn requires that power be removed from the circuit. For example, the steps for using a conventional, fixed core type current probe generally include turning off the power to the DUT, unsoldering the wire from the circuit, threading the wire through the current probe, soldering the wire to the circuit, and applying power to the DUT. Of course, these same steps must be repeated every time the current probe is moved to another location or removed from the circuit.

Use of any type of conventional current probes typically involves physically cutting a conductive trace, e.g., on a printed circuit board, of the DUT. A wire is then soldered to each end of the cut trace, and the current probe is used to measure current passing through the soldered wire. The properties and position of the soldered wire affect the accuracy and repeatability of the measurement. For example, the length, width, shape (e.g., coiled) and orientation of the soldered wire all factor into the measurement result. Therefore, if any of these variables change between measurements, the results will not be repeatable or otherwise consistent with respect to one another.

SUMMARY

In a representative embodiment, a current probe is provided enabling measurement of current of a signal in circuit, such as a device under test (DUT). The current probe includes a ferrite core defining a gap, a wire wrapped around the ferrite core and configured to receive the signal from the circuit, and a magnetic field sensor positioned in the gap of the ferrite core. The current of the signal flowing in the wire generates a magnetic field in the ferrite core. The magnetic field generated in the ferrite core flows through the magnetic field sensor, which produces a voltage proportional to an intensity of the magnetic field. The current is measured based on the voltage produced by the magnetic field sensor.

In another representative embodiment, a current probe enabling measurement of current of a signal in a circuit, such as a DUT, includes first and second magnetic field sensors, and a wire wrapped around the first and second magnetic field sensors. The first magnetic field sensor is configured to produce a first voltage proportional to an intensity of a first magnetic field, and the second magnetic field sensor, arranged in a differential pair configuration with the first magnetic field sensor, is configured to produce a second voltage proportional to an intensity of a second magnetic field. The wire is configured to receive the signal from the circuit, the current of the signal flowing in the wire generating the first and second magnetic fields. The current is measured based on the first and second voltages produced by the first and second magnetic field sensors.

In another representative embodiment, a closed core current probe enabling measurement of a signal in a DUT includes magnetic field generating means for generating a magnetic field in response to a current of the signal, voltage producing means for producing a voltage proportional to an intensity of the generated magnetic field, and connection means for detachably connecting with a retention module connected in series with a circuit of the DUT carrying the signal being measured. The current is measured based on the voltage produced by the voltage producing means. Also, the connection means includes a protrusion configured to separate flexible contacts of the retention module to redirect the signal to the magnetic field generating means when the connection means are connected with the retention module.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
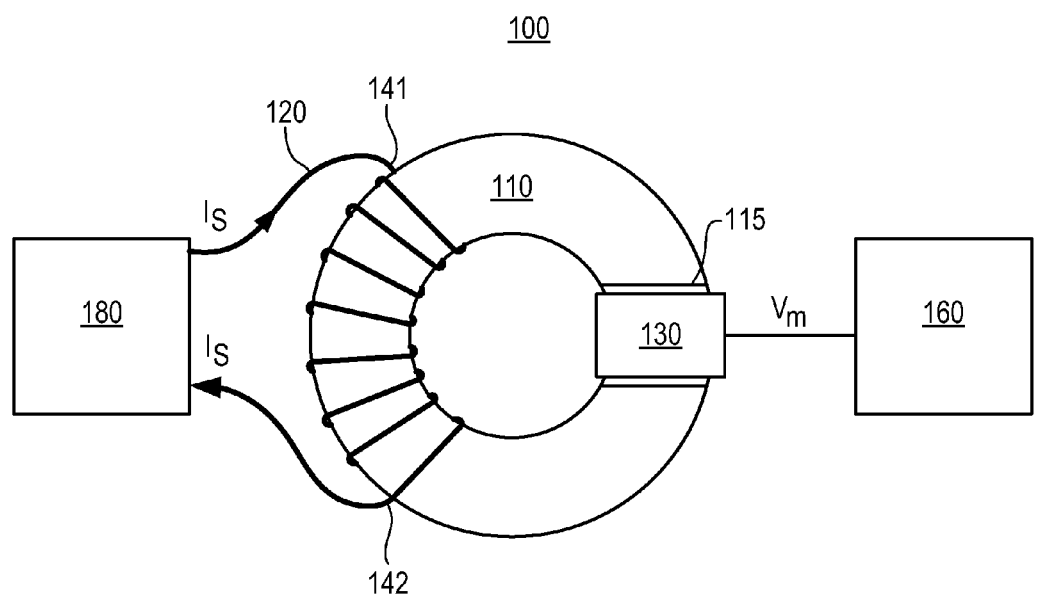
FIG. 1 is a simplified block diagram of a current probe circuit, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

According to various embodiments, an AC/DC current probe has a closed core, enabling the current probe to be much smaller than conventional split core current probes. In addition, the length and orientation of the current carrying conductor of the current probe and a retention module to which the current probe is detachably connected are fixed, so the current probe has greater sensitivity and measurement repeatability.

FIG. 1 is a simplified block diagram of a current probe, according to a representative embodiment.

Referring to FIG. 1, current probe 100 enables measurement of current $I_s$ from a signal passing through an electrical circuit, such as representative device under test (DUT) 180. The current probe 100 is an AC/DC closed core current probe, and thus is much smaller than conventional split core current probes, as discussed above. The current probe 100 includes ferrite core 110, which defines gap 115. The ferrite core 110 may be formed of a high permeablility material, such as nickel-zinc compounds, for example, and is substantially circular in shape. Of course, the ferrite core 110 may be formed of various alternative high permeability materials and may have various different shapes, without departing from the scope of the present teachings.

Wire 120 forms a wire loop wrapped around the ferrite core 110, such that current $I_s$ flows through the wire 120 and generates a magnetic field in the ferrite core 110. In the depicted configuration, the wire 120 is wound around the ferrite core 110 eight times (eight turns), for example. The intensity (magnitude) of the magnetic field varies directly proportionally with the number of turns of the wire 120, and thus more turns will result in a more intense or stronger magnetic field and fewer turns will result in a less intense or weaker magnetic field for the same level of current $I_s$. The current probe 100 is connected in series with a circuit in the DUT 180, as discussed below with reference to FIG. 7, to measure the electrical signal passing through the DUT circuit, such that the wire 120 receives the current $I_s$ from the DUT 180 at input port 141 and outputs the current $I_s$ back to the DUT 180 from output port 142. Generally, the intensity of the magnetic field is directly proportional to the amount of current $I_s$ in the wire 120, the number of turns of wire 120, the size of the ferrite core 110, and the permeability of the material forming the ferrite core 110. Increases in the intensity of the magnetic field translate to increases in gain and thus the sensitivity of the current probe 100.

Magnetic field sensor 130 is positioned in the gap 115 of the ferrite core 110. The magnetic field sensor 130 may be a Hall Effect sensor, for example, although any compatible type of magnetic field sensor may be incorporated without departing from the scope of the present teachings. The magnetic field generated in the ferrite core 110 flows through the magnetic field sensor 130, which produces measurement voltage $V_m$ proportional to the intensity of the magnetic field. More particularly, magnetic flux flows out of one side of the gap 115, through the magnetic field sensor 130 and into the other side of the gap 115, and the magnetic field sensor 130 produces the measurement voltage $V_m$ proportional to the intensity and direction of the magnetic flux. The current $I_s$ in the DUT 180 can then be determined, e.g., by processing circuit 160, based on the voltage $V_m$ output by the magnetic field sensor 130.

For example, when the magnetic field sensor 130 is a Hall Effect sensor, it has a plate to which voltage is applied. As the magnetic field impinges on the plate, it forces positive charges to one side of the plate and negative charges to the other side of the plate. This creates a voltage difference across the plate that is proportional to the strength of the field, and thus proportional to the amount of the current $I_s$ flowing through the wire 120. The current probe 100 (including the magnetic field sensor 130) has a corresponding transfer function or conversion factor, expressed as Volts/Amp. For example, with a transfer function of 0.1 V/A, the current probe 100 will output a voltage of 0.1 volts for every Amp of current $I_s$ flowing through the wire 120.

The intensity of the magnetic field varies directly proportionally to the magnitude of the current $I_s$ flowing in the wire 120. Also, the direction of the magnetic field corresponds to the phase of the current $I_s$ flowing in the wire 120. For example, when the current $I_s$ has a sinusoidal waveform, the direction of the magnetic field reverses each time the waveform changes from positive to negative and vice versa. The phase of the voltage $V_m$ produced by the magnetic field sensor 130 is determined by the direction of the magnetic field, and the phase of the current $I_s$ is based on the phase of the voltage $V_m$ produced by the magnetic field sensor 130. Thus, the relative phases of the voltage $V_m$ correspond to the relative phases of the current $I_s$, reproducing the sinusoidal waveform of the current $I_s$.

Figure 2:
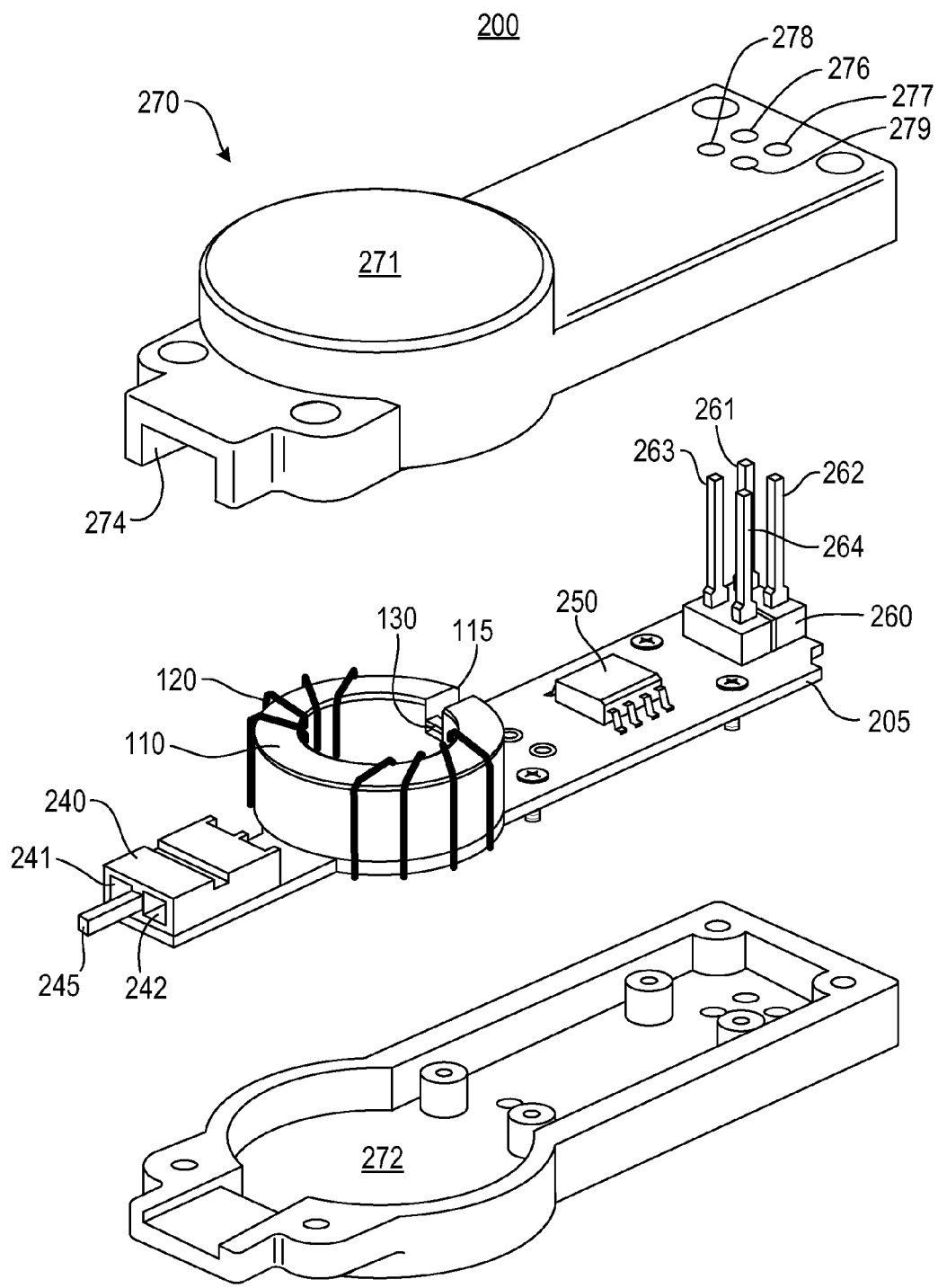
FIG. 2 is an exploded perspective view of a current probe, according to a representative embodiment.

FIG. 2 is an exploded perspective view of a current probe, e.g., including the current probe circuit discussed above with reference to FIG. 1, according to a representative embodiment.

Referring to FIG. 2, closed core current probe 200 includes probe printed circuit board (PCB) 205 contained within housing 270, which includes top and bottom housing parts 271 and 272. Connected to the PCB 205 are ferrite core 110, wire 120 wound around the ferrite core 110, and magnetic field sensor 130 disposed in gap 115 defined by the ferrite core 110, as discussed above. The housing 270 may be formed of metal or other durable material to protect the various components mounted to the PCB 205, e.g., from physical impact, moisture, temperature, external magnetic and electrical fields, and the like.

Connector 240 is attached to one end of the PCB 205 to enable connection in series with a circuit (e.g., DUT 180). The connector 240 includes input port (socket) 241 for receiving current $I_s$ from the DUT circuit and output port (socket) 242 for outputting the current $I_s$ to the DUT circuit after measurement. The input port 241 is connected to a first end of the wire 120 and the output port is connected to an opposite second end of the wire 120, so that the current $I_s$ flows from the DUT 180 through the wire 120. The connector 240 also includes a beak or protrusion 245 extending from between the input and output ports 241, 242. The protrusion 245 is configured to separate flexible clamp contacts of a retention module fastened to the DUT circuit when the current probe 200 is detachably mounted in the retention module, discussed below with reference to FIGS. 5A-5C and 6A-6B. The input port 241, the output port 242 and the protrusion 245 are exposed through current signal opening 274 formed by the top and bottom housing parts 271 and 272 of the housing 270. Of course, other types of connectors may be incorporated for supplying the current $I_s$ from the DUT 180 to the current probe 200 without departing from the scope of the present teachings.

The PCB 205 also includes (optional) amplifier 250 and voltage connector 260. The amplifier 250 is configured to increase gain of the voltage $V_m$ output by the magnetic field sensor 130. The amplifier 250 may be an operational amplifier, for example, although other types of amplifying circuits may be included. The voltage connector 260 includes output voltage contacts 261 and 262 for outputting the (amplified) voltage $V_m$, indicative of the current $I_s$ measured by the current probe 200. The output voltage contacts 261 and 262 may be voltage and ground reference, respectively, for example. The voltage connector 260 further includes input voltage contacts 263 and 264 for receiving input to the current probe 200, which may be applied to the magnetic field sensor 130 and the amplifier 350, for example. In the depicted illustrative configuration, the output and input voltage contacts 261-264 extend through corresponding voltage signal openings 276-279, respectively, in the top housing part 271 of the housing 270.

Figure 3:
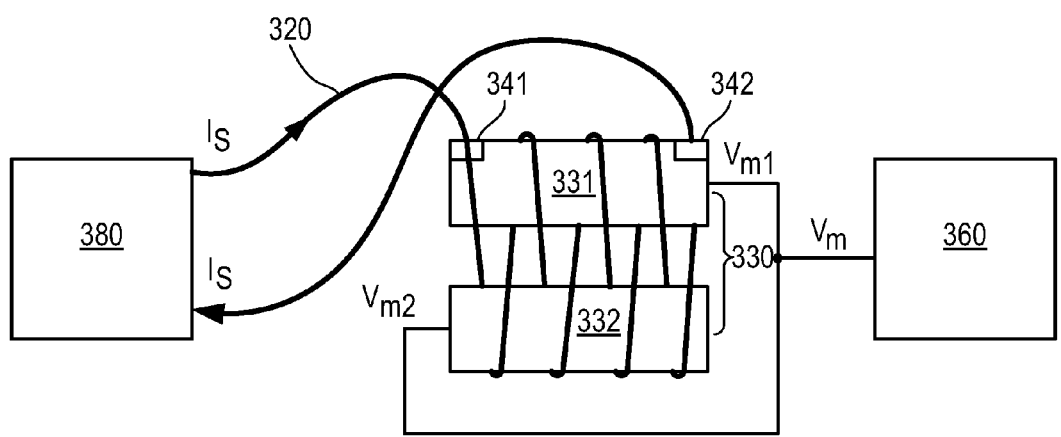
FIG. 3 is a simplified block diagram of a current probe circuit, according to a representative embodiment.

FIG. 3 is a simplified block diagram of a current probe, according to another representative embodiment.

Referring to FIG. 3, current probe 300 enables measurement of current $I_s$ from a signal passing through an electrical circuit, such as representative DUT 380. The current probe 300 is an AC/DC closed core current probe, and thus is much smaller than conventional split core current probes, as discussed above. The current probe 300 includes magnetic field sensor pair 330, including first magnetic field sensor 331 and second magnetic field sensor 332, which are physically arranged in a differential configuration. Accordingly, the first and second magnetic field sensors 331 and 332 form a differential pair. Each of the first and second magnetic field sensors 331 and 332 may be a Hall Effect sensor, for example, although any compatible type of magnetic field sensor may be incorporated without departing from the scope of the present teachings.

Wire 320 forms a wire loop wrapped around each of the first and second magnetic field sensors 331 and 332 in the magnetic field sensor pair 330. The current $I_s$ flows through the wire 320 and generates a first magnetic field around the first magnetic field sensor 331 and generates a second magnetic field around the second magnetic field sensor 332. This creates greater magnetic gain since the magnetic flux from the wire 320 impinges on each of the first and second magnetic field sensors 331 and 332 from four sides. In the depicted configuration, the wire 320 is wound around each of the first and second magnetic field sensors 331 and 332 four times (four turns) in a figure-eight pattern, for example, although the number of windings and/or the winding patterns may vary, without departing from the scope of the present teachings.

Notably, in the depicted configuration, the number of turns of the wire 320 is the same around each of the first and second magnetic field sensors 331 and 332. Accordingly, the intensities of the respectively generated first and second magnetic fields will be substantially equal to one another. Because the first and second magnetic field sensors 331 and 332 are arranged in a differential configuration, the first and second voltages $V_{m1}$ and $V_{m2}$ generated in response to the first and second magnetic fields will be added together, thereby creating a magnetic-to-voltage gain about twice that created by either of the first or second magnetic field sensors 331 and 332 alone. That is, the magnetic-to-voltage gain of the current probe 300 is the sum of the respective magnetic-to-voltage gains of the first and second magnetic field sensors 331 and 332.

Further, the differential configuration provides greater immunity to external magnetic fields, which can be difficult and bulky to shield against. More particularly, external magnetic fields generate opposite external magnetic field voltages in the first and second magnetic field sensors 331 and 332, which tend to cancel out, particularly where the first and second magnetic field sensors 331 and 332 have the same number of windings of the wire 320, as in the present example. For example, the first magnetic field sensor 331 may generate a positive external magnetic field voltage in response to the external magnetic field, and the second magnetic field sensor 332 may generate a negative external magnetic field voltage in response to the external magnetic field, the negative external magnetic field voltage substantially canceling out the positive external magnetic field voltage, thereby removing effects of the external magnetic field on the current measurement.

The intensities (magnitudes) of the first and second magnetic fields of the first and second magnetic field sensors 331 and 332 vary directly proportionally with the respective number of turns of the wire 320, and thus more turns will result in more intense or stronger magnetic fields and fewer turns will result in less intense or weaker magnetic fields for the same level of current $I_s$. The intensities of the first and second magnetic fields are also directly proportional to the amount of current $I_s$ in the wire 320. Increases in the intensities of the first and second magnetic fields translate to increases in gain and thus the sensitivity of the current probe 300. The current probe 300 is connected in series with a circuit in the DUT 380, as discussed below with reference to FIG. 7, to measure the electrical signal passing through the DUT circuit, such that the wire 320 receives the current $I_s$ from the DUT 380 at input port 341 and outputs the current $I_s$ back to the DUT 380 from output port 342.

The first and second magnetic fields generated by the current $I_s$ in the wire 320 flows through the first and second magnetic field sensors 331 and 332, respectively. In response, the first and second magnetic field sensors 331 and 332 produce first and second voltages $V_{m1}$ and $V_{m2}$ proportional to the intensities of the first and second magnetic fields, respectively. The first and second voltages $V_{m1}$ and $V_{m2}$ are combined (e.g., added) to provide combined measurement voltage $V_m$. The current $I_s$ in the DUT 380 can then be determined, e.g., by processing circuit 360 based on the voltage $V_m$ provided by the magnetic field sensor pair 330. The first and second magnetic field sensors 331 and 332 thus combine to produce effectively twice the output voltage $V_m$ than would be generated by either first and second magnetic field sensors 331 and 332 alone, thus providing the current probe 300 with greater sensitivity. When the first and second magnetic field sensors 331 and 332 are Hall Effect sensors, for example, they each have a plate to which voltage is applied. As the magnetic field impinges on each plate, it creates a voltage difference across the plate that is proportional to the strength of the field, and thus proportional to the amount of the current $I_s$ flowing through the wire 320, in accordance with a transfer function, as discussed above.

The intensities of the first and second magnetic fields vary directly proportionally to the magnitude of the current $I_s$ flowing in the wire 320. Also, the direction of each of the first and second magnetic fields corresponds to the phase of the current $I_s$ flowing in the wire 320. For example, when the current $I_s$ has a sinusoidal waveform, the direction of the each of the first and second magnetic fields reverses each time the waveform changes from positive to negative and vice versa. The phases of the first and second voltages $V_{m1}$ and $V_{m2}$ are determined by the direction of the first and second magnetic fields, respectively. The phase of the current $I_s$ is based on the phases of the voltages $V_{m1}$ and $V_{m2}$ produced by the magnetic field sensor pair 330. Notably, the length of the wire 320 wrapped around the first and second magnetic field sensors 331 and 332 is substantially shorter than the wavelength of the current pulses passing through the wire 320. Thus, there is not enough electrical length of the wire 320 for there to be negative effects that could be detected in the measurement.

Figure 4:
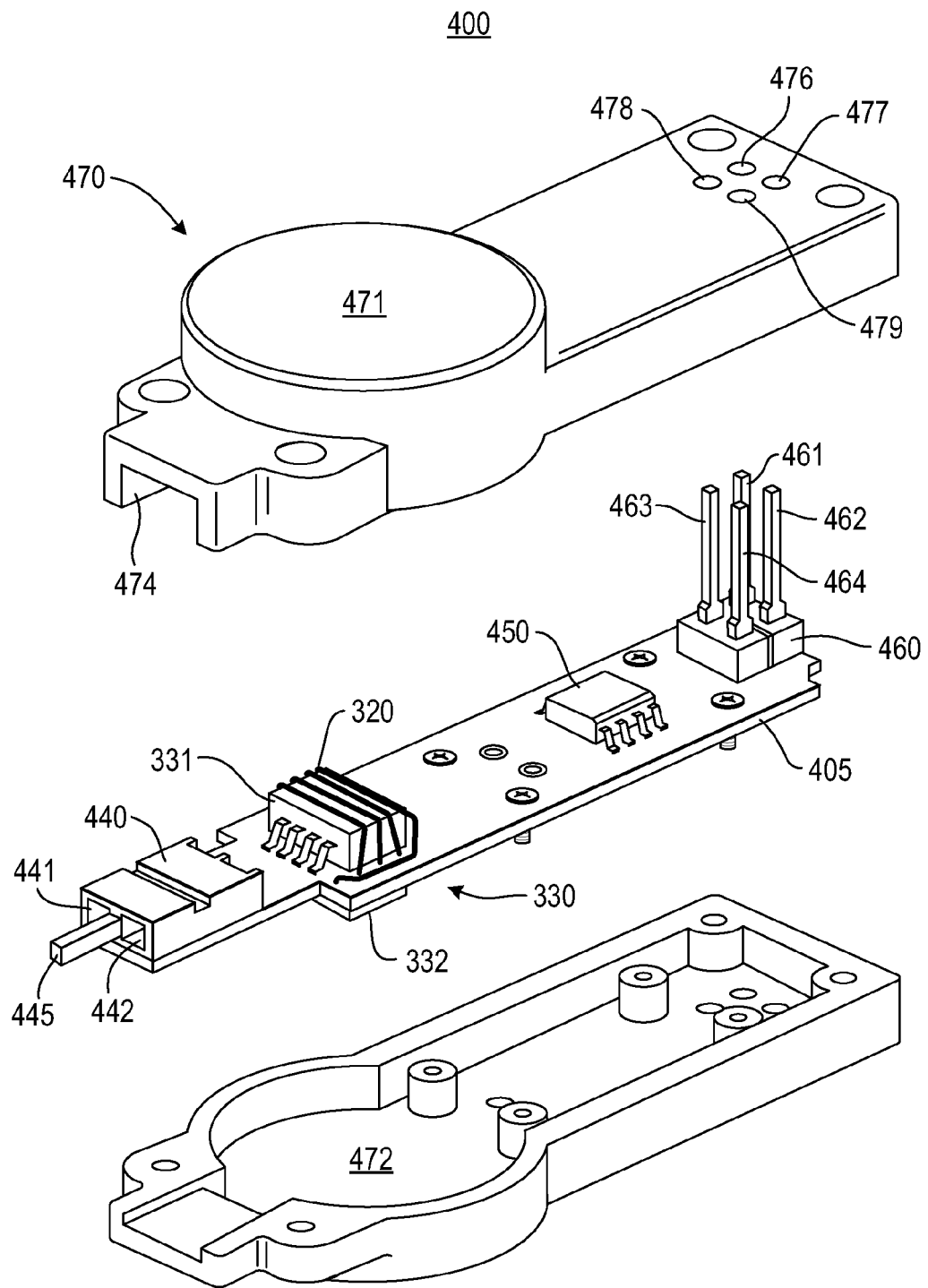
FIG. 4 is an exploded perspective view of a current probe, according to a representative embodiment.

FIG. 4 is an exploded perspective view of a current probe, e.g., including the current probe circuit discussed above with reference to FIG. 3, according to a representative embodiment.

Referring to FIG. 4, closed core current probe 400 includes probe PCB 405 contained within housing 470, which includes top and bottom housing parts 471 and 472. The housing 470 may be formed of metal or other durable material to protect the various components mounted to the probe PCB 405, e.g., from physical impact, moisture, temperature, external magnetic and electrical fields, and the like. Connected to the probe Probe PCB 405 are first and second magnetic field sensors 331 and 332 in the magnetic field sensor pair 330 and wire 320 wound around the first and second magnetic field sensors 331 and 332 in an illustrative figure-eight configuration, as discussed above. The first and second magnetic field sensors 331 and 332 are physically arranged in a differential configuration, with the first magnetic field sensor 331 positioned on a top surface of the probe PCB 405 and the second magnetic field sensor 332 positioned on a bottom surface of the probe PCB 405 immediately beneath the first magnetic field sensor 331. The figure-eight winding of the wire 320 must therefore pass through holes in the probe PCB 405. Of course, alternative arrangements of the first and second magnetic field sensors 331 and 332 and/or alternative windings of the wire 320 may be incorporated without departing from the scope of the present teachings.

Connector 440 is attached to one end of the probe PCB 405 to enable connection in series with a circuit (e.g., DUT 380). The connector 440 includes input port (socket) 441 for receiving current $I_s$ from the DUT circuit and output port (socket) 442 for outputting the current $I_s$ to the DUT circuit after measurement. The input port 441 is connected to a first end of the wire 320 and the output port is connected to an opposite second end of the wire 320, so that the current $I_s$ flows from the DUT 380 through the wire 320. The connector 440 also includes a beak or protrusion 445 extending from between the input and output ports 441 and 442, as discussed above with reference to the protrusion 245. The input port 441, the output port 442 and the protrusion 445 are exposed through current signal opening 474 formed by the top and bottom housing parts 471 and 472 of the housing 470. Of course, other types of connectors may be incorporated for supplying the current $I_s$ from the DUT 380 to the current probe 400 without departing from the scope of the present teachings.

The probe PCB 405 may also include amplifier 450 and voltage connector 460. The amplifier 450 is configured to increase gain of the voltage $V_m$, which is the sum of the first and second voltages $V_{m1}$ and $V_{m2}$ output by the first and second magnetic field sensors 331 and 332, respectively. The amplifier 450 may be an operational amplifier, for example, although other types of amplifying circuits may be included. The voltage connector 460 includes output voltage contacts 461 and 462 for outputting the (amplified) voltage $V_m$, indicative of the current $I_s$ measured by the current probe 400. The voltage connector 460 further includes input voltage contacts 463 and 464 for receiving input voltage applied to the current probe 400, as discussed above. In the depicted illustrative configuration, the output and input voltage contacts 461-464 extend through corresponding voltage signal openings 476-479, respectively, in the top housing part 471 of the housing 470.

Notably, the current probes 100, 200, 300 and 400 described above have greater sensitivity, and measurements performed using the current probes 100-400 are more repeatable, as compared to conventional current probes. The length of the wires 120, 320 is constant, and with respect to the current probes 100 and 200, the permeability of the ferrite core 110 is constant. Also, there are no variables dependent upon the user's handling of the connections, or the positioning of the current probes 100-400, etc., particularly since they are closed core and thus much smaller than conventional split core current probes. Thus, each time the current probes 100-400 are connected in series with the DUT circuit, the ensuing measurements will be consistent with other measurements from the same point.

As mentioned above, the closed core current probes, according to the various representative embodiments, may be detachably mounted in a retention module that is fastened (permanently or temporarily) to the DUT circuit carrying the current to be measured. Configurations of the retention modules may vary, although each configuration includes at least fixed lengths and shapes of conductors (e.g., wires) leading to and from the DUT circuit in order to eliminate variations in measurement that may otherwise result from different conductor lengths. Each configuration further includes fixed mounting means to hold the current probe securely in place at a fixed distance and orientation with respect to the DUT circuit in order to eliminate variations in measurement that may otherwise result from variations in positioning of the current probe during the measurement process. Of course, the closed current probes discussed herein may be attached to the DUT circuit for receiving a current by any of a variety of means, which may or may not include use of a retention module, without departing from the scope of the present teachings.

Figure 5A:
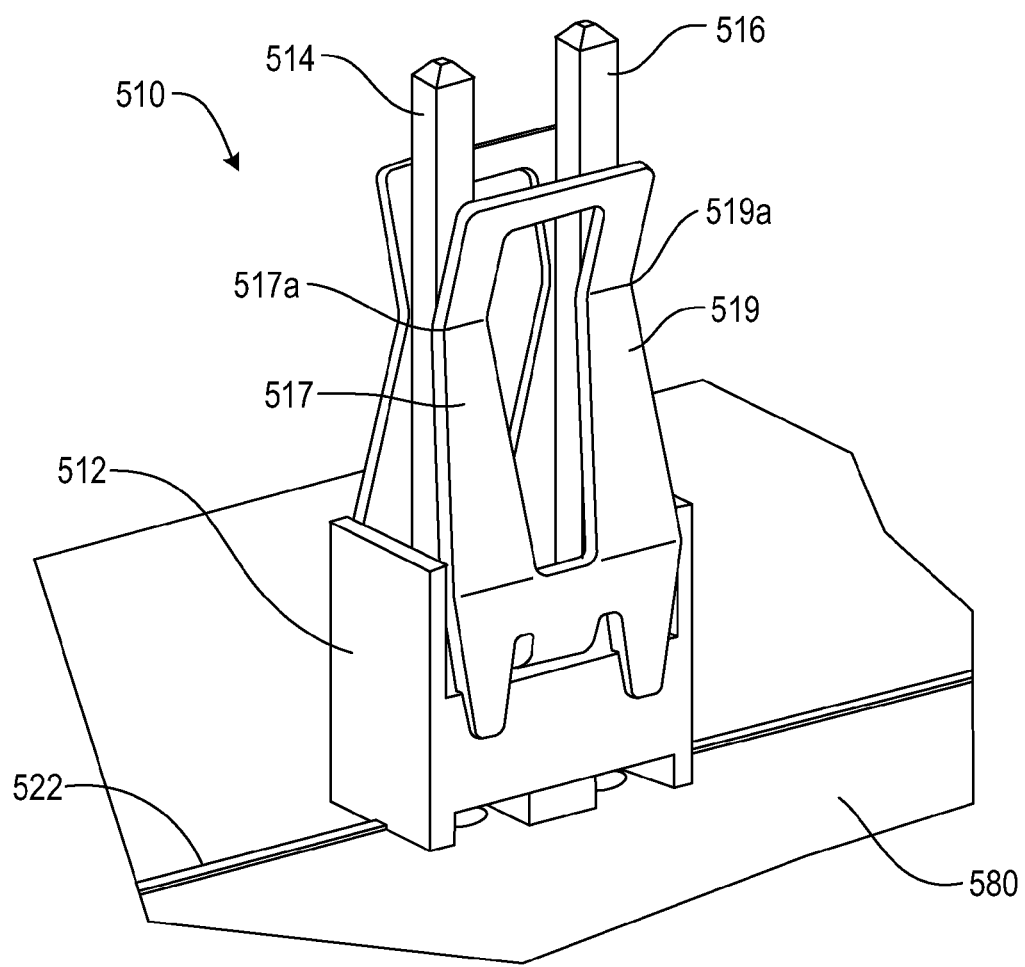
FIG. 5A is a side perspective view of a retention module, according to a representative embodiment.
Figure 5B:
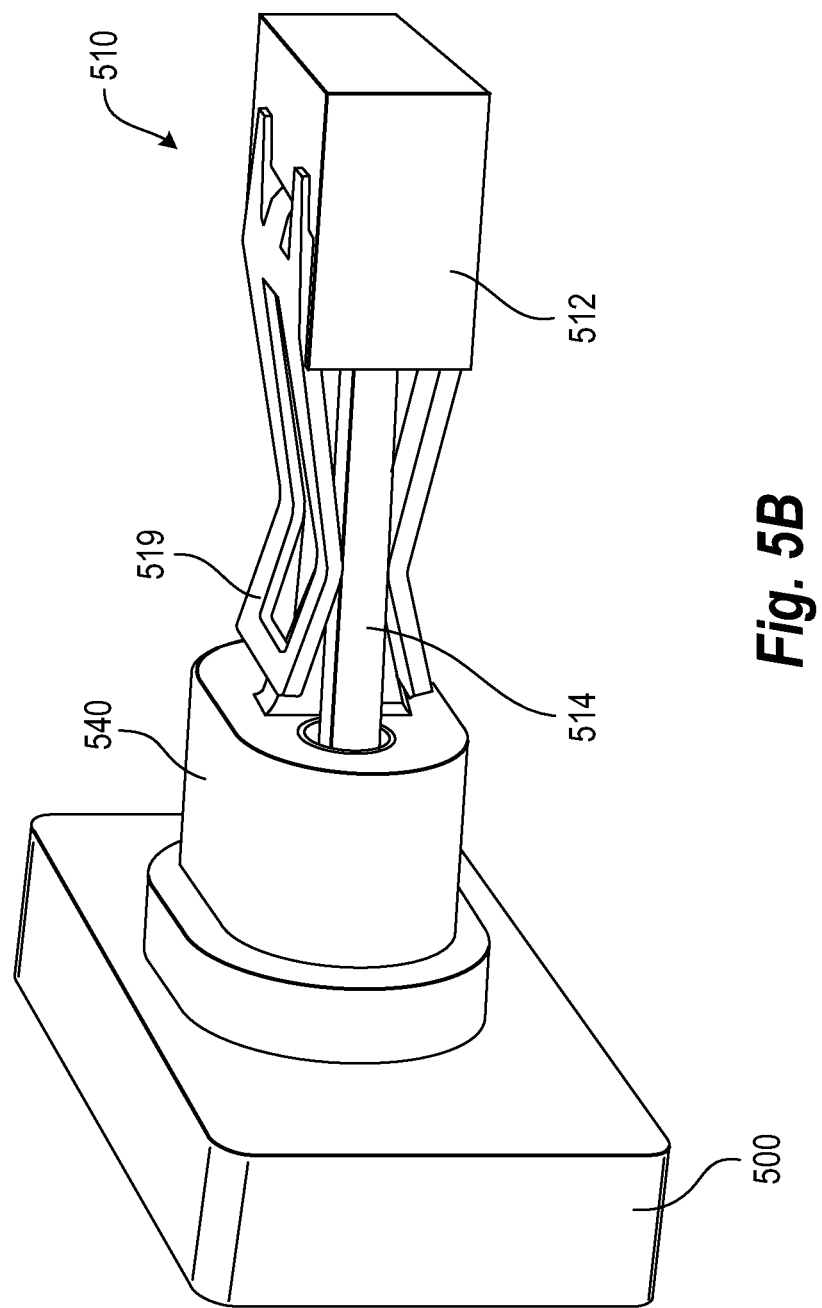
FIG. 5B is a side perspective view of the retention module of FIG. 5A, with a current probe connected, according to a representative embodiment.
Figure 5C:
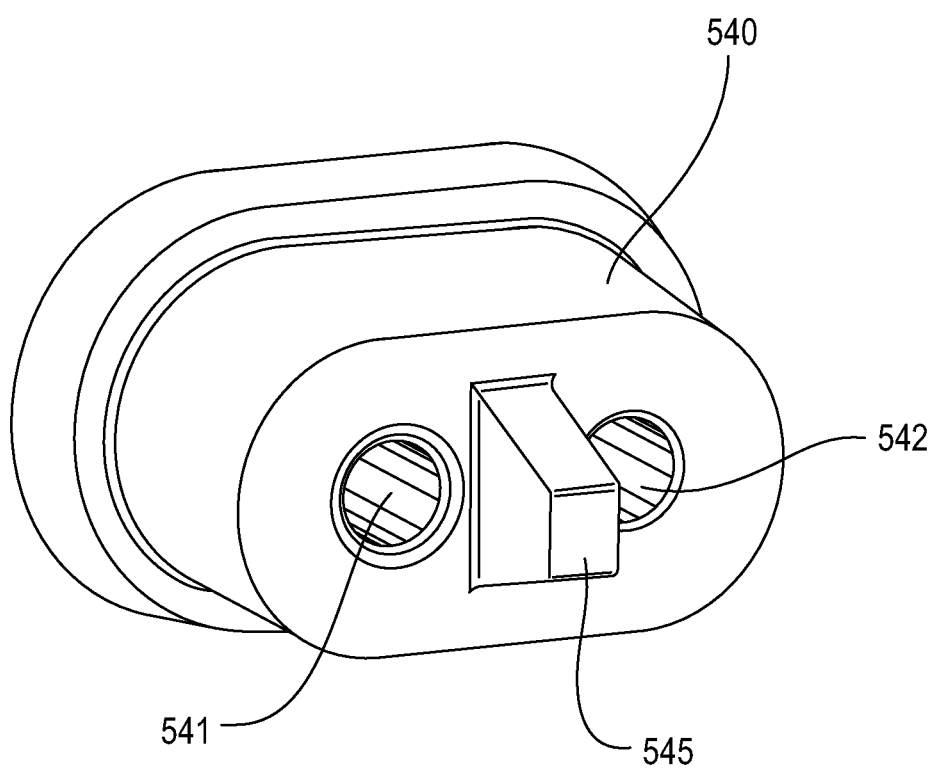
FIG. 5C is a side perspective view of a current probe connector for use with the retention module of FIG. 5A, according to a representative embodiment.

FIG. 5A is a side perspective view of a retention module, according to a representative embodiment, and FIG. 5B is a side perspective view of the retention module of FIG. 5A, with a closed core current probe connected, according to a representative embodiment. FIG. 5C is a perspective view of connector 540 which may be attached to current probe circuitry (e.g., on PCB 205, 405, discussed above) to enable mounting of the current probe.

Referring to FIGS. 5A and 5B, surface mounted retention module 510 is configured to fit securely on the surface of DUT 580 via contacts (not shown) at a desired measurement area over conductive trace 522, and to hold a closed core current probe 500 (which may be one of representative current probes 100-400 discussed above) in place and to provide electrical contact with the current probe 500 via conductive prongs 514 and 516. The conductive prongs 514 and 516 have fixed lengths and shapes to provide stable, consistent and repeatable measurement results from the measurement process. The current probe 500 and/or the surface mounted retention module 510 may be repeatedly removed from and re-attached to the DUT 580 between measurements, without removing power.

The surface mounted retention module 510 includes the conductive prongs 514 and 516, which extend from retention module body 512. First and second flexible clamp contacts 517 and 519 press against the conductive prongs 516 and 514 at respective angled portions 517a and 519a. As shown in FIG. 5A, the first and second flexible clamp contacts 517 and 519 thereby create an electrical circuit or shunt between the conductive prongs 514 and 516 through which current from the conductive trace 522 passes whenever there is no current probe inserted into the surface mounted retention module 510. The first and second flexible clamp contacts 517 and 519 are spring loaded so that they are generally forced toward one another, causing the first and second flexible clamp contacts 517 and 519 to exert pressure against opposite sides of the conductive prongs 514 and 516 at the angled portions 517a and 519a to create a solid mechanical and electrical connection.

Referring to FIGS. 5B and 5C, the connector 540 includes input port 541 and output port 442, which are configured as discussed above with regard to input ports 241, 441 and output ports 242, 442, respectively. The connector 540 further includes beak or protrusion 545, having a partial wedge shape, for example, which extends from between the input and output ports 541 and 542. The protrusion 545 is configured to force apart the first and second flexible clamp contacts 517 and 519 via mechanical contact with the angled portions 517a and 519a as current probe 500 is pressed into the surface mounted retention module 510. The conductive prongs 514 and 516 are meanwhile insertable into the input and output ports 541 and 542, respectively, making electrical contact with the current probe circuit of the current probe 500. As the protrusion 545 forces apart the first and second flexible clamp contacts 517 and 519, the angled portions 517a and 519a break physical and electrical contact with the conductive prongs 514 and 516, eliminating the shunt and redirecting the current in the conductive trace 522 of the DUT 580 (e.g., current $I_s$) to flow through the current probe 500 via the input and output ports 542 and 542, as discussed above. This enables measurement of the current by the current probe 500. In an embodiment, the conductive prongs 514 and 516 make contact with the input and output ports 541 and 542 before the protrusion 545 opens the shunt, so that the flow of the current is not interrupted.

In various configurations, the retention module body 512 of the surface mounted retention module 510 may be formed of various lightweight materials capable of supporting the current probe 500, such as plastic, and the conductive prongs 514 and 516 and the first and second flexible clamp contacts 517 and 519 may be formed of various conductive materials, such as copper or aluminum, for example. The protrusion 545 of the surface mounted retention module 510 may have a width compatible with circuits of a typical PCB, for example, in a range of about 0.1 inch to about 0.2 inch. The surface mounted retention module 510 may be configured for use with types of current probes other than those discussed herein.

Figure 6A:
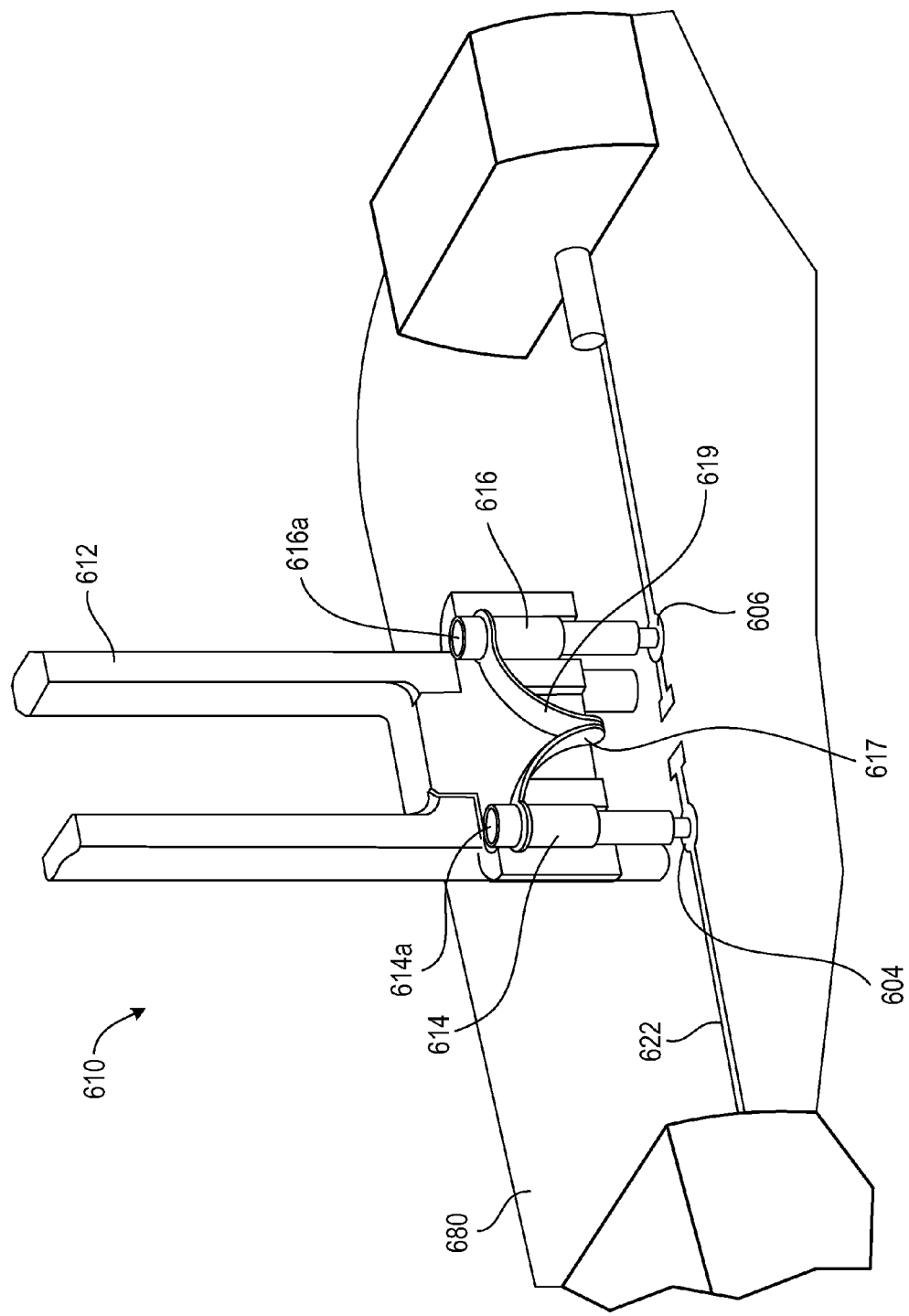
FIG. 6A is a side perspective view of a retention module, according to a representative embodiment.
Figure 6B:
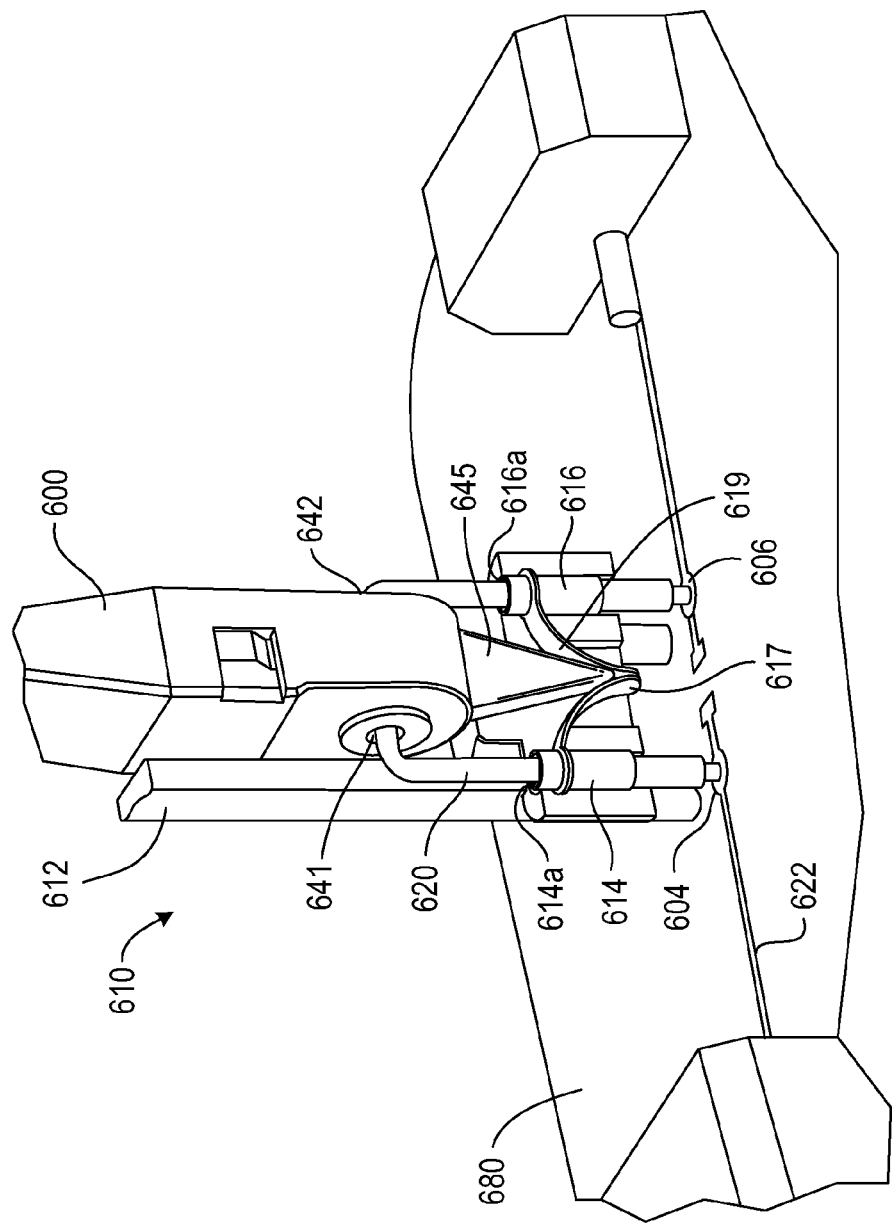
FIG. 6B is a side perspective view of the retention module of FIG. 6A, with a current probe connected, according to a representative embodiment.

FIG. 6A is a side perspective view of a retention module, according to another representative embodiment, and FIG. 6B is a side perspective view of the retention module of FIG. 6A, with a closed core current probe connected, according to a representative embodiment.

Referring to FIGS. 6A and 6B, surface mounted retention module 610 is configured to fit securely on the surface of DUT 680 at a desired measurement area, and to hold a closed core current probe 600 (which may be one of representative current probes 100-400 discussed above) in place throughout the measurement process, establishing electrical contact through retention module connectors 614 and 616. The retention module connectors 614 and 616 have fixed lengths and shapes to provide stable, consistent and repeatable measurement results from the measurement process. The current probe 600 and/or the surface mounted retention module 610 may be repeatedly removed from and re-attached to the DUT 680 between measurements, without removing power.

The surface mounted retention module 610 is shown mounted to the surface of the DUT 680 over conductive trace 622. The surface mounted retention module 610 includes a probe receiving portion 612, which is configured to enable slideable insertion and removal the current probe 600 (e.g., representative current probes 100-400 discussed above). The surface mounted retention module 610 also includes retention module connectors 614 and 616, which may be mechanically fastened to the conductive trace 622, as discussed below with reference to FIG. 7. The retention module connectors 614 and 616 include sockets 614a and 616a, respectively.

In addition, the surface mounted retention module 610 includes a pair of flexible arch contacts 617 and 619, respectively fastened to the retention module connectors 614 and 616. As shown in FIG. 6A, the flexible arch contacts 617 and 619 are touching one another, thus creating an electrical circuit or shunt between the retention module connectors 614 and 616 through which current from the conductive trace 622 passes whenever there is no current probe inserted into the surface mounted retention module 610. The arched configuration generally causes the flexible arch contacts 617 and 619 to flex upward, resulting in the flexible arch contacts 617 and 619 exerting pressure on one another to create a solid mechanical and electrical connection.

FIG. 6B, in particular, shows the current probe 600 inserted in the surface mounted retention module 610. The current probe 600 includes input port 641, output port 642 and protrusion 645, substantially having a wedge shape, for example, which extends from between the input and output ports 641 and 642. Notably, the current probe 600 in the depicted embodiment has a somewhat different style connector than the connectors 240, 440 and 540, discussed above. The input and output ports 641 and 642 are arranged on opposite sides of the housing as opposed to next to one another on one end of the housing. Also, instead of the retention module connectors 614 and 616 being inserted into the input and output ports 641 and 642, the opposite ends of the wire 620, which extends from the current probe 600 (via the input and output ports 641 an 642) to enable insertion into the sockets 614a and 616a of the retention module connectors 614 and 616, respectively. Otherwise, the circuitry of the current probe 600 is substantially the same as discussed above with reference to current probes 100-400.

The protrusion 645 is configured to force apart the flexible arch contacts 617 and 619, breaking the electrical and physical connections between them, eliminating the shunt and redirecting the current in the conductive trace 622 of the DUT 680 (e.g., current $I_s$) to flow through the current probe 600 via the input and output ports 641 and 642, as discussed above. This enables measurement of the current by the current probe 500. The probe receiving portion 612 holds the current probe 600 in a fixed position, and wire 620 is inserted into sockets 614a and 616a of the retention module connectors 614 and 616, respectively, enabling measurement of the current via techniques discussed above with reference to FIGS. 1-4, for example.

At a basic level, the surface mounted retention module 610 essentially functions as a traditional 0.1 inch connector, for example. The current probe 600 plugs into the surface mounted retention module 610 much like mating two connectors, although the flexible arch contacts 617 and 619 act like a shunt when the current probe 600 is not inserted, allowing the flow of current between the contacts 604 and 606. As mentioned above, the current probe 600 includes the protrusion 645 (exaggerated for clarity) configured to open the connection between the flexible arch contacts 617 and 619 after the current probe 600 has made contact with the mating contacts in the surface mounted retention module 610. This results in current flow from the conductive trace 622 being diverted from the shunt (closed flexible arch contacts 617 and 619), and being rerouted through the wire 620 passing into the current probe 600. Accordingly, the current flow through the DUT 680 is not interrupted, and the current probe 600 may be inserted and removed without removing power from the DUT 680.

In various configurations, the surface mounted retention module 610 may be formed of various lightweight materials capable of supporting the current probe 600, such as plastic, and the retention module connectors 614, 616 and the flexible arch contacts 617, 619 may be formed of various conductive materials, such as copper or aluminum, for example. The surface mounted retention module 610 may have a width compatible with circuits of a typical PCB, for example, in a range of about 0.1 inch to about 0.2 inch. The surface mounted retention module 610 may be configured for use with types of current probes other than those discussed herein.

Figure 7:
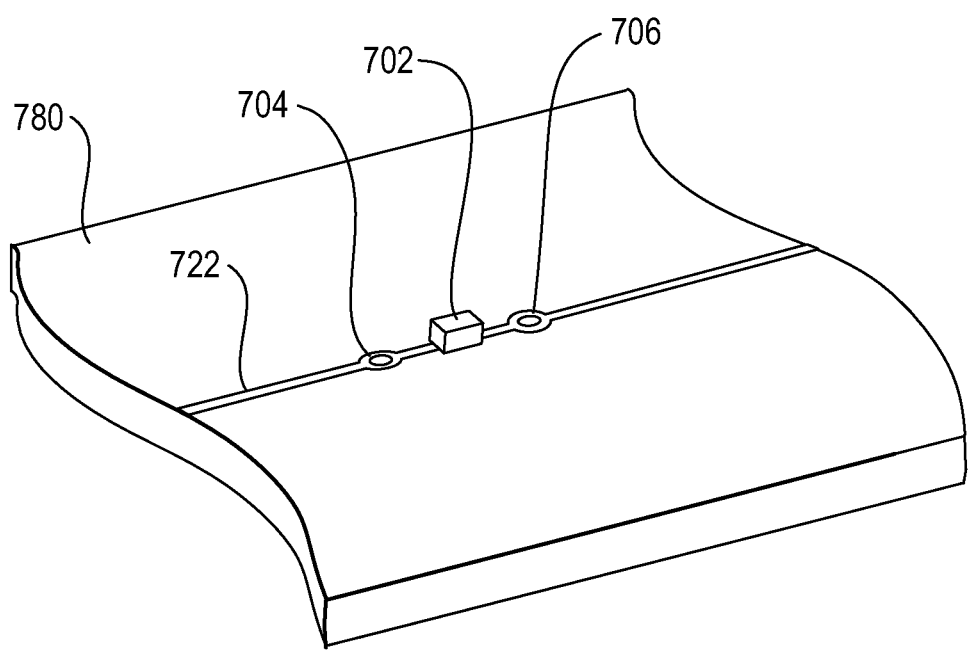
FIG. 7 is a top perspective view of a circuit configured to receive a retention module, according to a representative embodiment.

As mentioned above, the closed core current probes of the various embodiments are connected in series with a DUT circuit carrying the current to be measured. FIG. 7 is a top perspective view of an illustrative circuit configured to receive a retention module, according to a representative embodiment, in which the current probe is detachably mounted.

Referring to FIG. 7, the DUT circuit includes representative conductive trace 722, which runs across the surface of representative DUT 780. In order to accommodate current measurement, the conductive trace 722 may be physically cut in the area directly beneath a surface mounted retention modules, such as surface mounted retention module 510 discussed above with reference to FIGS. 5A-5C and/or surface mounted retention module 610 discussed above with reference to FIGS. 6A-6B. Alternatively, the DUT 780 and/or the conductive trace 722 may be designed with predetermined features enabling connection of the retention modules without having to manually cut the trace. For example, FIG. 7 shows the DUT 780 before attachment of a retention module, where the DUT 780 has a predetermined attachment region that includes removable zero ohm resistor 702 and holes in retention module contacts 704 and 706.

To use the retention module, the resistor 702 is removed (e.g., by de-soldering), creating an open within the conductive trace 722 for performing current measurements. The retention module is then connected between the ends of the conductive trace 722 by inserting retention module connectors into the holes of retention module contacts 704 and 706, respectively, and mechanically connecting them in place, e.g., by soldering. In alternative configurations, the retention module contacts 704 and 706 may include pads in place of the holes for soldering the connectors. Also, the holes may be through-holes that extend through a portion of the surface of the DUT 780 to an interior trace, enabling connection of the retention module. Of course, in the event the DUT 780 does not include a predetermined attachment region, the conductive trace 722 may be manually cut at the desired measurement location, and the retention module connecters may simply be soldered to the ends of the cut conductive trace 722. In this case, the retention module connectors may be substantially L-shaped at the bottom to run along corresponding portions the conductive trace 722, thus increasing the mechanical contact areas for improved soldering.

Generally, the retention modules (e.g., surface mounted retention modules 510, 610) are small surface mounted components that are attachable to a DUT. The surface mounted retention module serves as a mechanical locator and retainer for a closed core, AC or AC/DC current probe (e.g., current probes 100-600), as well as a fixed path through which current travels when the current probe is not inserted. Use of the surface mounted retention module removes a number of user variables from the measurement process, including length of wire, position of probe, position of conductor relative to probe coil, magnetic field sensors and the like, resulting in more stable and repeatable measurements, and thus more sensitive measurements (greater sensitivity). Further, the current probe may be inserted, removed and/or relocated to another retention module without having to turn off power to the DUT or soldering/unsoldering a wire. It thus reduces the opportunity for error (e.g., bad solder joints, twisted wire, soldering to the wrong pad) and makes the installation, removal and movement of the current probe easier and faster.

While specific embodiments are disclosed herein, many variations are possible, which remain within the concept and scope of the present teachings. Such variations would become clear after inspection of the specification, drawings and claims herein. The invention therefore is not to be restricted except within the scope of the appended claims.

What is claimed is:

1. A current probe enabling measurement of current of a signal in a circuit, the current probe comprising:
    a first magnetic field sensor configured to produce a first voltage proportional to an intensity of a first magnetic field;
    a second magnetic field sensor arranged in a differential configuration with the first magnetic field sensor, and configured to produce a second voltage proportional to an intensity of a second magnetic field; and
    a wire wrapped around and in physical contact with the first and second magnetic field sensors and configured to receive the signal from the circuit, the current of the signal flowing in the wire generating the first and second magnetic fields,
    wherein the current is measured based on the first and second voltages produced by the first and second magnetic field sensors, and
    wherein the wire is wrapped around the first and second magnetic field sensors in a figure-eight configuration.

2. The current probe of claim 1, wherein a magnetic-to-voltage gain of the current probe is a sum of magnetic-to-voltage gains of the first and second magnetic field sensors, respectively.

3. The current probe of claim 1, wherein the first magnetic field sensor generates a positive voltage in response to an external magnetic field, and the second magnetic field sensor generates a negative voltage in response to the external magnetic field, the negative voltage substantially canceling out the positive voltage, thereby removing effects of the external magnetic field on the current measurement.

4. The current probe of claim 1, wherein each of the first and second magnetic field sensors comprises a Hall Effect sensor.

5. The current probe of claim 1, further comprising:
a connector comprising an input port connected to a first end of the wire and an output port connected to a second end of the wire, wherein the connector is configured to be detachably mounted to a retention module connected in series with the circuit to be measured, the retention module comprising conductive prongs insertable in the input port and output port of the connector, respectively.

6. The current probe of claim 5, wherein the retention module further comprises first and second flexible clamp contacts configured to press against the conductive prongs when the current probe is not inserted, creating a shunt between the conductive prongs through which the signal from the circuit passes, and to break contact with the conductive prongs when the current probe is inserted, allowing the signal from the circuit to flow through the wire of the current probe; and
wherein the current probe further comprises:
a protrusion extending from the connector and configured to separate the first and second flexible clamp contacts from the conductive prongs of the retention module when the current probe is inserted.

7. A closed core current probe enabling measurement of a signal in a device under test (DUT), the closed core current probe comprising:
a printed circuit board;
magnetic field generating means for generating a magnetic field in response to a current of the signal;
voltage producing means for producing a voltage proportional to an intensity of the generated magnetic field, the voltage producing means comprising a pair of sensors arranged opposite one another on opposite sides of the printed circuit board, wherein the current is measured based on the voltage produced by the voltage producing means; and
connection means for detachably connecting the closed core current probe with a retention module connected in series with a circuit of the DUT carrying the signal being measured, the connection means comprising a protrusion configured to separate flexible contacts of the retention module to redirect the signal to the magnetic field generating means when the connection means are connected with the retention module,
wherein the magnetic field generating means comprise a wire wrapped around each of the sensors of the pair sensors and configured to receive the signal from the DUT.

8. The closed core current probe of claim 7, wherein the wire is wrapped around each of the sensors of the pair of sensors for multiple turns in a figure-eight configuration, the wire passing through the printed circuit board each turn to from the figure-eight configuration.

9. The closed core current probe of claim 7, wherein the pair of sensors comprises a differential pair of Hall Effect sensors, and the magnetic field generating means comprise a wire wrapped around each of the Hall Effect sensors of the differential pair of Hall Effect sensors and configured to receive the signal from the DUT.

10. A current probe enabling measurement of current of a signal in a circuit, the current probe comprising:
a first magnetic field sensor configured to produce a first voltage proportional to an intensity of a first magnetic field;
a second magnetic field sensor arranged in a differential configuration with the first magnetic field sensor, and configured to produce a second voltage proportional to an intensity of a second magnetic field; and
a wire wrapped around the first and second magnetic field sensors and configured to receive the signal from the circuit, the current of the signal flowing in the wire generating the first and second magnetic fields,
wherein the current is measured based on the first and second voltages produced by the first and second magnetic field sensors,
wherein the wire is wrapped around the first and second magnetic field sensors in a figure-eight configuration.

11. The current probe of claim 10, further comprising:
a printed circuit board, wherein the first magnetic field sensor and the second magnetic field sensor are arranged on opposite sides of the printed circuit board, and the wire wrapped around the first and second magnetic field sensors passes through the printed circuit board to form the figure-eight configuration.

12. The current probe of claim 10, wherein a magnetic-to-voltage gain of the current probe is a sum of magnetic-to-voltage gains of the first and second magnetic field sensors, respectively.

13. The current probe of claim 10, wherein the first magnetic field sensor generates a positive voltage in response to an external magnetic field, and the second magnetic field sensor generates a negative voltage in response to the external magnetic field, the negative voltage substantially canceling out the positive voltage, thereby removing effects of the external magnetic field on the current measurement.

14. The current probe of claim 10, wherein each of the first and second magnetic field sensors comprises a Hall Effect sensor.

15. The current probe of claim 10, further comprising:
a connector comprising an input port connected to a first end of the wire and an output port connected to a second end of the wire, wherein the connector is configured to be detachably mounted to a retention module connected in series with the circuit to be measured, the retention module comprising conductive prongs insertable in the input port and output port of the connector, respectively.

16. The current probe of claim 15, wherein the retention module further comprises first and second flexible clamp contacts configured to press against the conductive prongs when the current probe is not inserted, creating a shunt between the conductive prongs through which the signal from the circuit passes, and to break contact with the conductive prongs when the current probe is inserted, allowing the signal from the circuit to flow through the wire of the current probe; and
wherein the current probe further comprises:
a protrusion extending from the connector and configured to separate the first and second flexible clamp contacts from the conductive prongs of the retention module when the current probe is inserted.

* * * * *